United States Patent [19]

Imamura

[11] Patent Number: 5,528,186

[45] Date of Patent: Jun. 18, 1996

[54] TIMING GENERATOR USING DIGITAL SIGNALS TO OBTAIN ACCURATE DELAY TIME AND HIGH RESOLUTION

[75] Inventor: Makoto Imamura, Tokyo, Japan

[73] Assignee: Yokogawa Electric Corporation, Tokyo, Japan

[21] Appl. No.: 398,713

[22] Filed: Mar. 6, 1995

[30] Foreign Application Priority Data

Mar. 22, 1994 [JP] Japan .................................. 6-050378
Mar. 31, 1994 [JP] Japan .................................. 6-062441

[51] Int. Cl.⁶ .................................................. H03H 11/26
[52] U.S. Cl. ........................... 327/266; 327/263; 327/172; 327/336
[58] Field of Search ................................. 327/261, 263, 327/266, 172, 336, 141

[56] References Cited

U.S. PATENT DOCUMENTS

| | | | |
|---|---|---|---|
| 3,566,161 | 2/1971 | Clark | 327/262 |
| 4,359,649 | 11/1982 | Miindel | 327/132 |
| 5,138,204 | 8/1992 | Imamura et al. | 327/263 |
| 5,214,680 | 5/1993 | Gutierrez, Jr. et al. | 377/20 |
| 5,220,203 | 6/1993 | McMorrow, Jr. et al. | 327/176 |

*Primary Examiner*—Timothy P. Callahan
*Assistant Examiner*—Kenneth B. Wells
*Attorney, Agent, or Firm*—Moonray Kojima

[57] ABSTRACT

A timing generator, which is simple in construction and is capable of high speed operation with excellent linearity and low power consumption, wherein a delayed timing signal is generated by delaying an input timing signal. The generator comprises a switch having one end thereof connected to a first voltage source and which is controlled by the input timing signal, a current source provided between the other end of the switch and a second voltage source; a charge injection circuit generating a voltage signal which is turned ON and OFF in accordance with the input timing signal; a capacitor provided between the output end of the charge injection circuit and the other end of the switch; and a comparator generating a delayed timing signal by comparing the voltage at the other end of the switch with a desired voltage, wherein the delay time of the delayed timing signal is adjusted by controlling either the voltage outputted from the charge injection circuit or the current from the current source.

11 Claims, 4 Drawing Sheets

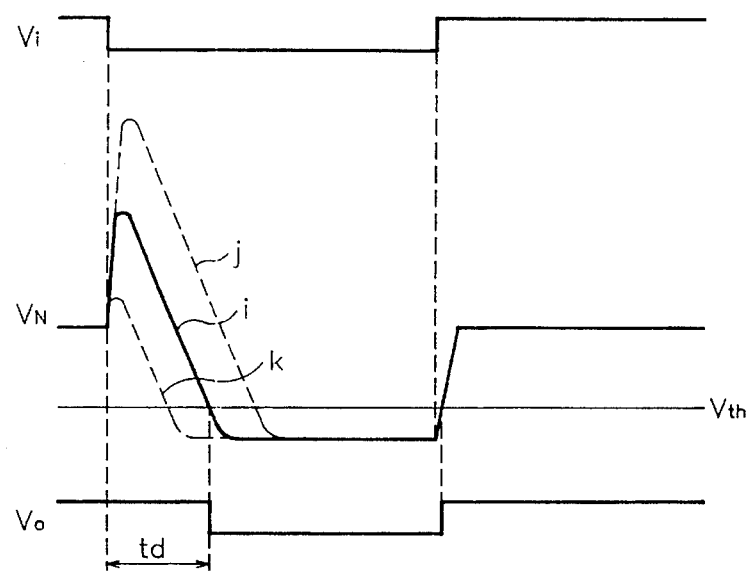
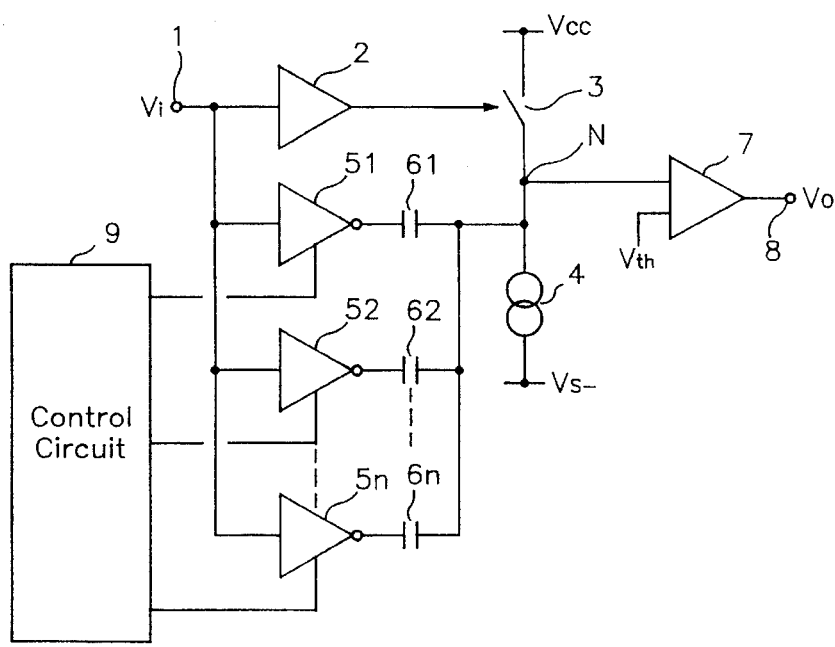

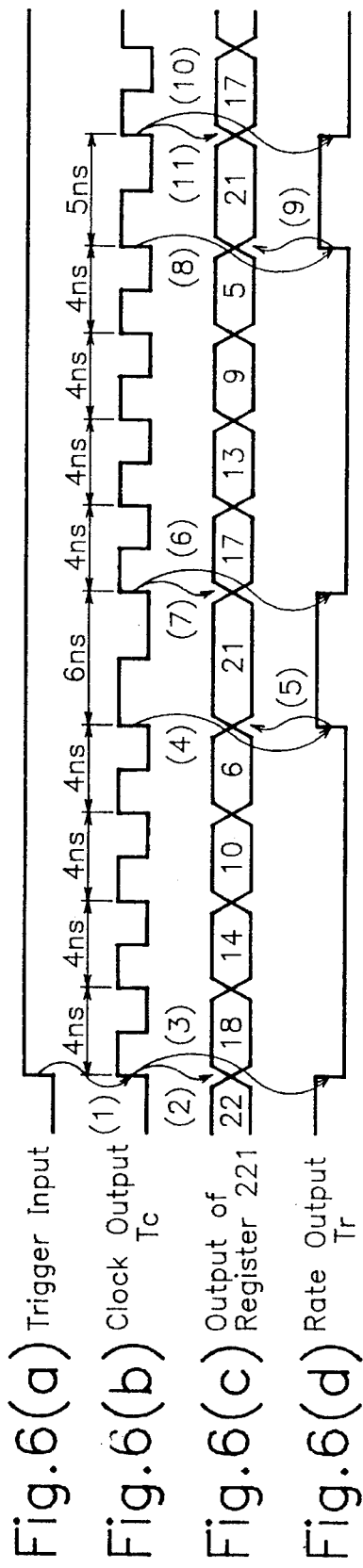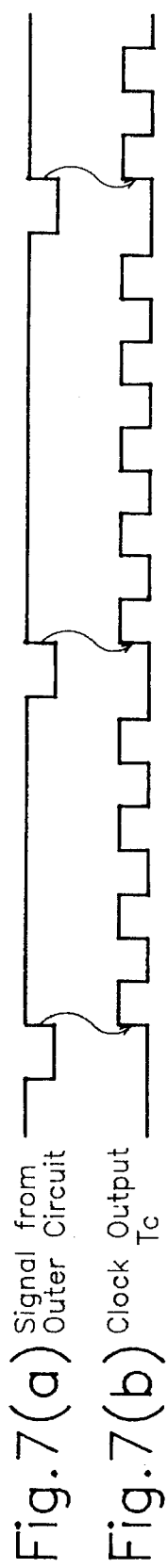

TIMING GENERATOR USING DIGITAL SIGNALS TO OBTAIN ACCURATE DELAY TIME AND HIGH RESOLUTION

BACKGROUND OF THE INVENTION

1. Field of Invention

This invention relates to a timing generator capable of generating a timing signal for an LSI tester and a pulse generator; and more particularly, to a low power consuming timing generator which is capable of setting a delay time with high accuracy and high resolution through use of a digital signal.

2. Description of the Prior Art

Conventionally, there has been used a programmable delay line, which may also be called a timing vernier, for setting with high accuracy a measurement timing for a digital LSI test system.

One example of such delay line makes use of a gate delay or a ramp generator. However, when a gate is used, the structure of the delay line is necessarily large so that it becomes necessary to make uniform the delay differences for switching. This makes it difficult to obtain linearity and monotonicity. Furthermore, when a ramp generator is used, the ramp waveform requires linearity so that a high quality capacitor is necessitated. Moreover, since the repetition frequency is limited by the ramp waveform, a high speed digital to analog converter is needed. This results in the ramp generating becoming unduly complex.

To solve the above problem, an apparatus, using a mirror amplifier based on feedback capacitance, was invented by the inventor hereof and is disclosed in U.S. Pat. No. 5,138,204. However, such an apparatus uses a shortened discharge time to speed operation. In order to shorten the discharge time, a buffer, comprising an emitter follower, may be added to the output of the differential amplification circuit of the mirror amplifier. In that case, the stability of the circuit may he affected since the circuit is or the feedback type. Furthermore, if an attempt is made to lower the output impedance of the mirror amplifier, without using the emitter follower, the load resistance has to be lowered, which results in increase of power consumption.

SUMMARY OF THE INVENTION

Accordingly, an object of the invention is to overcome the aforementioned and other deficiencies, problems and disadvantages of the prior art.

Another object is to provide a timing generator which is simple in structure and which is capable of performing high speed operation with excellent linearity and low power consumption.

BRIEF DESCRIPTION OF THE DRAWINGS

FIGS. 3(a)–3(c) are timing charts showing the operation of the embodiment of FIG. 1.

FIG. 4 is a block diagram depicting another illustrative embodiment of the inventin.

FIGS. 6(a)–6(d) are timing charts showing the operation of the timing generator of FIG. 5.

FIGS. 7(a) and 7(b) are timing charts showing the operation of the timing generator of FIG. 5 synchronized with operation of an external apparatus.

DETAILED DESCRIPTION OF THE PREFERRED EMBODIMENTS

Figure 1:
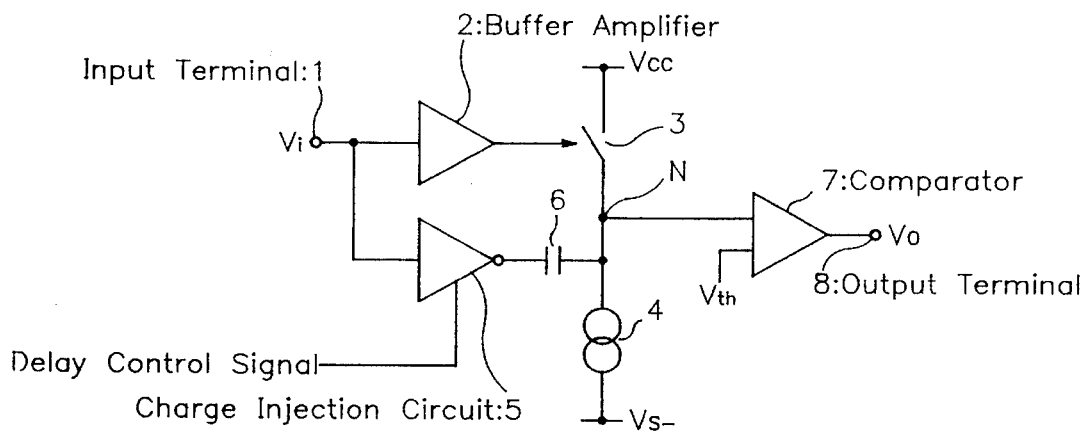
FIG. 1 is a block diagram depicting an illustrative embodiment of the invention.

FIG. 1 shows a timing generator comprising an input terminal 1 to which an input timing signal Vi is inputted; a buffer amplifier 2 which receives, as an input, input timing signal Vi through input terminal 1; and a switch 3 which is turned ON and OFF in response the output from buffer amplifier 2 and which has one end thereof connected to a first voltage Vcc. Switch 3 is, for example, formed or a transistor, and input timing signal Vi is inputted to the base of the transistor through buffer amplifier 2 and a current is applied between the collector and emitter of the transistor when the input timing signal is at an H-level. A current source 4 has one end thereof connected to the other end of switch 3 and another end thereof connected to a negative voltage Vs− as a second voltage. A charge injection circuit 5 receives, as an input, input timing signal Vi through input terminal 1 and outputs a voltage signal of a desired amplitude corresponding to a delay control signal on the basis of input timing signal Vi. A capacitor 6 has one end thereof connected to a common junction or node N disposed between switch 3 and current source 4. A comparator 7 compares the voltage at the other end, that is at node N, of switch 3 with a voltage Vth and outputs a delayed timing signal Vo through an output terminal 8.

Figure 2:
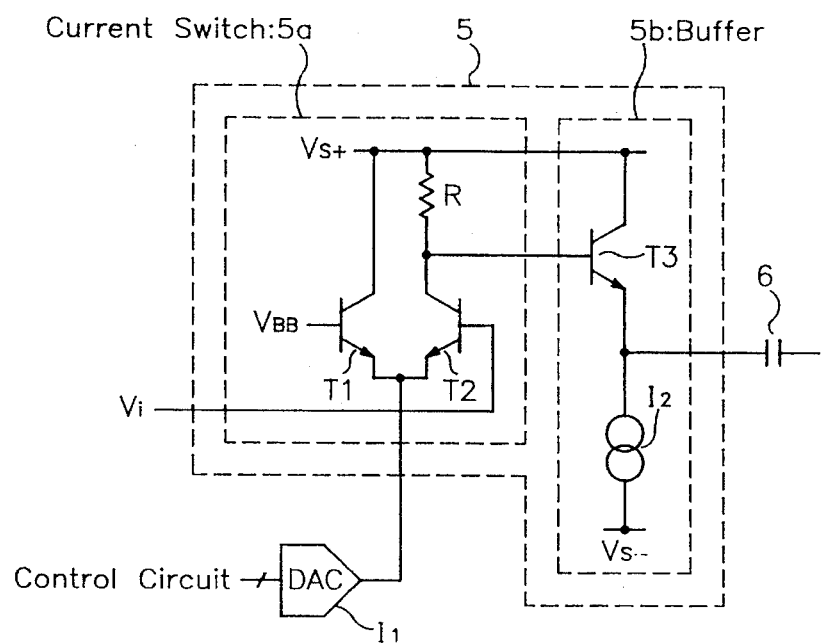
FIG. 2 is a circuit diagram depicting a charge injection circuit of the embodiment of FIG. 1.

FIG. 2 shows details of charge injection circuit 5 of FIG. 1, wherein a current switch 5a receives, as an input, input timing signal Vi through input terminal 1 of FIG. 1 and switches output current from D/A (digital to analog) converter I1 (labeled "DAC" in the drawing). Current switch 5a generates an output whose amplitude varies depending on a delay control signal, i.e, the output current, generated by D/A converter I1. The D/A converter I1 is controlled by a control circuit (not shown). A buffer 5b receives, as an input, an output from current switch 5a and generates an output to capacitor 6.

Current switch 5a comprises two NPN type transistors T1,T2, respectively, having their emitters connected to each other and to the other output terminal of D/A converter I1. Transistor T1 has its base connected to a voltage terminal $V_{BB}$ while transistor T2 receives, as an input, input timing signal Vi through its base. Transistor T1 has its collector connected to a voltage Vs+ while transistor T2 has its collector connected to voltage Vs+ through a resistor and D/A converter I1 adjusts the current flowing through transistors T1 and T2 by means of the control circuit.

Buffer 5b comprises an NPN type transistor T3 having its base connected to the collector of transistor T2 and having its collector connected to voltage Vs+. Transistor T3 has its emitter connected to a voltage Vs− through a constant current source I2. Capacitor 6 is also connected to the emitter of transistor T3.

The voltage relationships in the above case can be expressed by the expression Vs+≧Vcc>Vth>Vs−. Furthermore, voltage $V_{BB}$ is determined by the voltage value of the input timing signal Vi.

The operation of the above embodiment will now be described with reference to FIG. 3(a)–3(c), wherein FIG. 3(a) shows input timing signal Vi to be applied to input terminal 1, FIG. 3(b) shows a node voltage $V_N$ of node N, and FIG. 3(c) shows delayed timing signal Vo outputted from output terminal 8.

When input timing signal Vi varies from H-level to L-level, switch 3 is turned OFF, whereupon, the output of the charge injection circuit 5 goes from L-level to H-level. That is, input timing signal Vi is inputted to charge injection circuit 5 and current switch 5a changes the output from charge injection circuit 5 from an L-level to an H-level to generate an output through the buffer 5b. The amplitude of the output from current switch 5a varies when the value of current flowing through D/A converter I1 is varied by the control circuit. That is, since an emitter current $I_{EE}$ changes due to change in the current through D/A converter I1, the current flowing through resistor R changes so that the amplitude of the output from current switch 5a changes with the value of the output proportional to the output current from D/A converter I1.

When the output from charge injection circuit 5 goes from L-level to H-level, the voltage outputted from charge injection circuit 5 increases node voltage $V_N$ at node N located between switch 3 and current source 4 through capacitor 6. In this case, since switch 3 is turned OFF, the current from current source 4 causes capacitor 6 to discharge so that node voltage $V_N$ gradually drops.

When node voltage $V_N$ drops to voltage Vth, the delayed timing signal Vo from comparator 7 changes from H-level to L-level. Then, node voltage $V_N$ drops further until it reaches a predetermined value, i.e., a value determined by input timing signal vi at L-level thereby terminating the discharge operation of capacitor 6.

The maximum potential at node voltage $V_N$ is determined by the output from charge injection circuit 5. The amount of discharge from capacitor 6 per unit time is determined by the current from current source 4. Thus, when the current is constant, the amount of discharge becomes constant. Consequently, the time during which the node voltage $V_N$ drops to voltage Vth, is determined by-the output voltage from charge injection circuit 5, and increases in proportion to the output voltage. That is, during the time in which delayed timing signal Vo falls from the time of falling off the input timing signal Vi, delay time td is proportional to the value of current flowing through D/A converter I1. For example, suppose that the variation of node voltage $V_N$, due to the presently set current through D/A converter I1, is in the state shown by the solid line in FIG. 3(b). In this state, when the current flowing through D/A converter I1 is made large, the amplitude of charge injection circuit 5 output becomes large as shown by the broken line j in FIG. 3(b) so that delay time td becomes long. Inversely, when the current flowing through D/A converter I1 is made small, the amplitude of charge injection circuit 5 output becomes small as shown by the broken line k in FIG. 3(b) so that the delay time td is shortened.

The discussed delay time is determined by the following $$\frac{\text{(Amplitude of Output of Charge Injection circuit 5)} \times \text{(Capacitance of Capacitor 6)}}{\text{(Value of Current from Current Source 4)}}$$

From this expression, when the capacitance of capacitor 6 and the value of current from current source 4 are constant, the delay time changes in proportion to the amplitude of the output from charge injection circuit 5. That is, the delay time is proportional to the current from the D/A converter I1.

Next, when input timing signal Vi changes from L-level to H-level, switch 3 is turned ON, whereupon, the output from charge injection circuit 5 goes from H-level to L-level. As the output from charge injection circuit 5 goes from L-level when switch 3 is turned ON, capacitor 6 is charged with a voltage Vcc in a short length of time and node voltage $V_N$ becomes H-level Actually, however, a voltage drop takes place due to the transistor constituting switch 3 and node voltage $V_N$ takes a value which is lower than voltage Vcc.

Thus, by varying the value of D/A converter I1 output, it is possible to vary the delay time td. In this case, since the comparison level becomes constant, the delay time shows a favorable linearity and is suitable for achieving high resolution.

Furthermore, in order to speed up the operation of the apparatus, that is for shortening the discharge time of capacitor 6, even if a buffer is formed of an emitter follower, e.g., buffer 5b is added since it is an open loop type, the apparatus is stable with low power consumption and is capable of operating at high speed. Also, error in delay time, resulting from error in the capacitance of each capacitor, can be eliminated by adjusting the current from current source 4. Thus accuracy of the apparatus is improved considerably. Moreover, the invention is of a simple structure.

FIG. 4 shows a timing generator of another illustrative embodiment, wherein like parts to those of FIGS. 1 and 2 are designated with like reference symbols. The invention comprises a plurality of charge injection circuits 51–5n, respectively, each of which receives, as an input, input filming signal Vi through input terminal 1 and generates a voltage signal of a predetermined amplitude which is turned ON and OFF on the hasps of the input timing signal Vi. The charge injection circuits 51–5n have the same structure, for example, as the charge injection circuit 5 of FIG. 1. That is, the current applied to current switch 5a (of FIG. 2) is made a constant current source instead of the D/A converter I1 and ON/OFF switches are provided in the output stages of charge injection circuits 51–5n thereby enabling ON/OFF control of the circuits. Furthermore, the above ON/OFF control structure is such that, for example, current switch 5a is made to be of gate structure, that is, a transistor T1 receiving, as an input, an ON/OFF control signal through its base, is arranged parallel to transistor T2. Capacitors 61–6n of different capacitances are connected to charge injection circuits 51–5n and to current source 4. A control circuit 9 enables ON/OFF control of the outputs from charge injection circuits 51–5n.

Operation of the above embodiment of FIG. 4 will now be described. Control circuit 9, for example, turns ON charge injection circuit 51, and turns OFF charge injection circuits 52–5n. Then, control circuit 9 causes circuit 51 to receive, as an input, input timing signal Vi and to perform an operation similar to the embodiment of FIG. 1.

When the delay time is changed, charge injection circuits 51–5n, are connected respectively to capacitors 61–6n, which each of which has a capacitance corresponding to a desired delay time, are turned ON by control circuit 9, thereby performing the same operation as that for FIG. 1. Furthermore, control circuit 9 may be so formed that more than one of the charge injection circuits 51–5n can be turned ON by control circuit 9 so that the desired delay time may be obtained.

With the above embodiment, it is possible to prepare a desired delay time program by increasing the capacitance of each of the capacitors.

The invention is not limited to the embodiment above described. For example, the FIG. 1 embodiment may be so constructed that the voltage from charge injection circuit 5 is made constant and the delay time can be adjusted by adjusting current source 4. Also, the FIG. 4 embodiment may be constructed so that the values of voltages generated by charge injection circuits 51–5n are differentiated while the capacitances of capacitors 61–6n are made equal to one another and the delay time is adjusted by ON/OFF control of charge injection circuits 51–5n by control circuit 9.

Moreover, the embodiment may be so constructed that only one charge injection circuit is provided and capacitors of different capacitances are selected to adjust the delay time. Alternatively, only one capacitor need be provided and the charge injections selected to generate voltages of different values to adjust the delay time.

Furthermore, each of the charge injection circuits may be formed of a CMOS (complementary metal oxide semiconductor) switch. For example, charge injection circuit 5 of FIG. 1 may be constructed so that input timing signal Vi is caused to be inputted to the input terminal of the CMOS and capacitor 6 connected to the output terminal of the CMOS. Then, the current to he applied to the source electrode of the CMOS transistor is adjusted, thereby adjusting the delay time. Moreover, charge injection circuits 51–5n may also be formed of CMOS switches, respectively. That is, input timing signal Vi is caused to be inputted to the input terminal of the CMOS of charge injection circuit 5n selected by control circuit 9 so that a signal is generated at the output terminal of the CMOS to capacitor 6n. In this case, a predetermined voltage is applied to the source electrode of the CMOS transistor.

Figure 5:
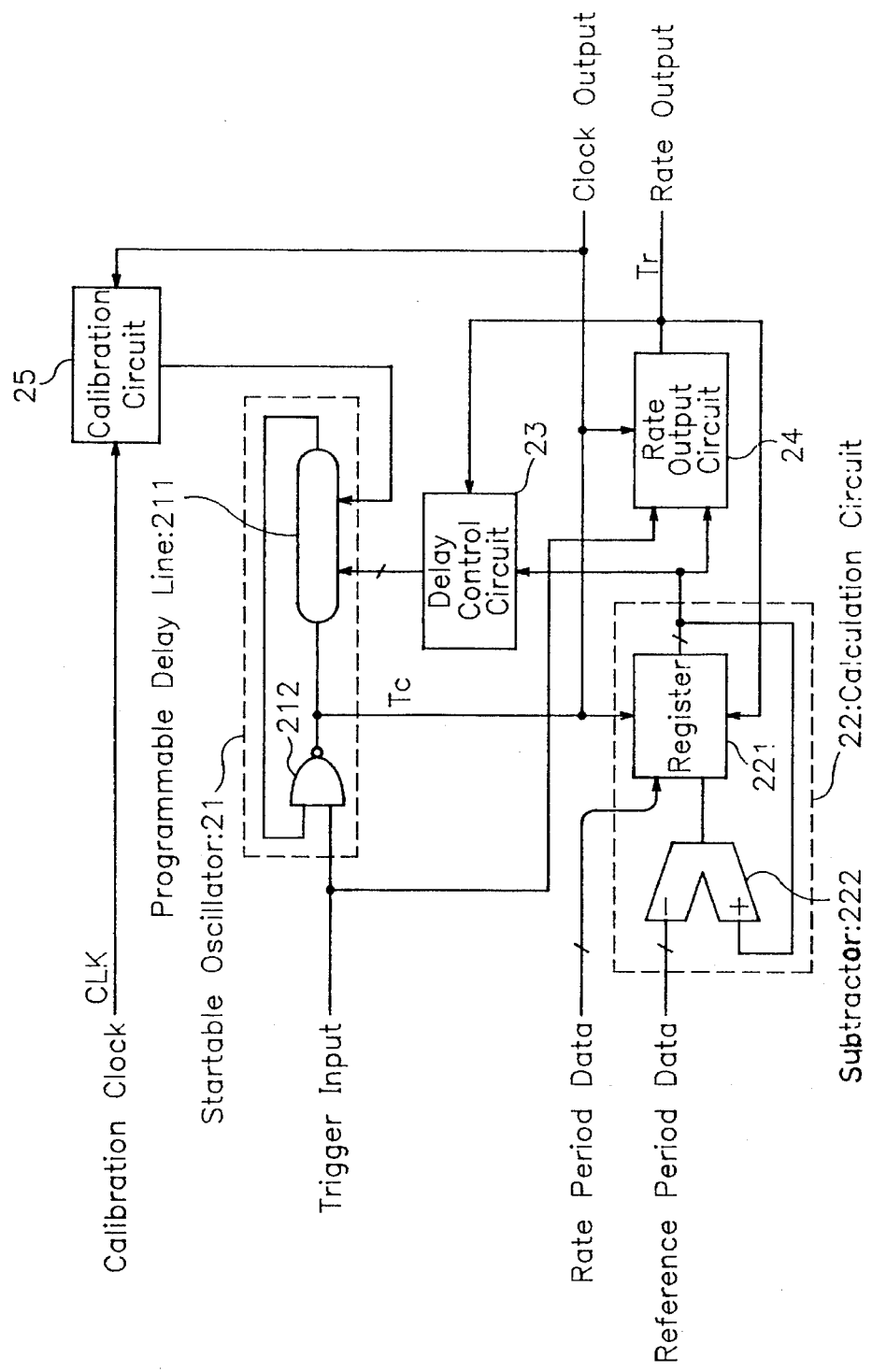
FIG. 5 is a block diagram depicting an exemplary use of the invention.

FIG. 5 shows an application of the invention comprising a startable oscillator 21, comprising a NAND gate 212 and a programmable delay line 211 which receives, as an input, a signal from NAND gate 212; a calculation circuit 22 which comprises a register 221 and a subtractor 222 and performs a calculating operation for obtaining a desired fraction for each clock output Tc generated by startable oscillator 21; a delay control circuit 23 which is inputted with calculation data from calculation circuit 22 and changes the amount of delay time of programmable delay line 211, thereby determining the period of clock output Tc; and a rate output circuit 24 which generates a rate output Tr in synchronism with clock output Tc outputted by oscillator 21, on the basis off the output data from calculation circuit 22. Furthermore, where an attempt is made to synchronize rate output circuit 24 with an external apparatus (not shown) rate output circuit 24 receives a signal from the external apparatus as a trigger input and such trigger input is outputted as the rate output Tr. The embodiment further comprises a calibration circuit 25 which adjusts the amount of delay time of programmable delay line 211 in accordance with an error of the clock output Tc outputted by startable oscillator 21 with respect to a calibration clock CLK.

The above embodiment of the timing generator may be used as the programmable delay line 211. That is, delay control circuit 23 causes data to be inputted to D/A coverter I1 in place of control circuit of FIG. 2. Furthermore, delay control circuit 23 may be so constructed that it includes these D/A converters I1.

In the startable oscillator 21, NAND gate 212 receives, as inputs, the trigger input and output from programmable delay line 211. The output from NAND gate 212 is caused to be inputted to progammable delay line 211. NAND gate 212 and the progammable delay line 211 form an oscillation loop. That is, when the output from NAND gate 212 is enabled by the trigger input, a clock output Tc whose frequency has twice the period of the loop delay, is outputted from NAND gate 212. In this case, the loop delay is programmable controlled by the signal from delay control circuit 23.

In calculation circuit 22, register 221 retains rate period data for determining the period of rate output Tr at the time of the rising of rate output Tr and also retains data from subtractor 222 for each clock output Tc generated by startable oscillator 21. The value of the data, thus retained by register 221, is applied to delay control circuit 23 and rate output circuit 24. Subtractor 222 subtracts, from the retained data, the reference period data which is a reference period value of clock output Tc and outputs a subtraction result to register 221.

Operation of the embodiment of FIG. 5 will now be described with reference to FIGS. 6(a)–6(d), wherein FIG. 6(a) shows a trigger input to startable oscillator 21, FIG. 6(b) shows a clock output Tc generated by startable oscillator 21, FIG. 6(c) shows an output from register 221, and FIG. 6(d) shows rate output Trgenerated by rate output circuit 24.

At an initial setting, the period of the clock output Tc from startable oscillator 21 is assumed to be "4 ns". Furthermore, the initial period of rate ouput Tr is assumed to he "22 ns" and the next period to be "21 ns". That is, the period "4 ns" is set as a reference period data, and the initial period "22 ns" and the next period "21 ns" are set as the rate period data.

When the trigger output rises, the startable oscillator 21 oscillates clock output Tc (1). In this case, subtractor 222 subtracts reference period data "4 ns" from rate output data "22 ns" which has been retained by register 221, and the subtracted value "18 ns" retained by register 221 when clock output Tc rises (2). Moreover, with the increase of clock output Tc, rate output circuit 24 causes rate output Tr to fall (3). Then, register 221 retains the value obtained by subtracting, in subtractor 222, reference period data "4 ns" from the value retained by register 221 every time clock output Tc from oscillator 21 rises.

Then, when the value of the output from register 221 becomes smaller than twice the reference period data, that is, smaller than "8ns", the rate output circuit 24 detects the value and causes the rate output Tr to rise with the rise of clock output Tc (4). With With the rise of rate output Tr, register 221 retains the rate period data "21 ns" which is the period of the next rate output Tr (5). At this time, since the output from register 221 is "6 ns", delay control circuit 23 changes the amount of delay of programmable delay line 211 when rate output Tr rises so that the period of clock output Tc becomes "6 ns". That is, in the example, clock output Tc outputted from oscillator 21 has reference period "4 ns" until four clock signals are counted, and when the fifth clock signal is counted, the period thereof becomes "6 ns" due to the odd period data (6 ns) from the calculation circuit 22.

With the next rise of changed clock output Tc, rate output circuit 24 causes the rate output to fall down (6). Moreover, delay control circuit 23 receives rate output Tr and resets the amount of delay of programmable delay line 211 to the original value so that the period of clock output Tc returns to the original value, i.e. "4 ns". Then, with the rise of the same clock output Tc, register 221 retains the value "17 ns" obtained by subtracting, in subtractor 222, the reference period data "4 ns" from the value "21 ns" (7).

Likewise, register 221 retains the value obtained by subtracting reference period data "4 ns" from the value retained by register 221 every time rate output Tr rises and oscillator 21 generates clock output Tc of period "4 ns" until the value retained by register 221 becomes smaller than "8 ns". With the rise of clock output Tc next to the output "5 ns" of register 221, delay control circuit 23 changes the amount of delay time so that the period of clock output Tc becomes "5 ns" and the rate output Tr rises (8). With the rise of this rate output Tr, register 221 retains rate period data "21 ns" (9). Then, when the next clock output Tr rises, rate output Tr falls (10) and with the rise of clock output Rc, register 221 retains the value "17 ns" which is obtained by subtracting, in subtractor 222, reference period data "4 ns" from value "21 ns" retained by register 221 (11).

Thus, by repeating the above operations, clock output Tc and rate output Tr are outputted.

As described, delay control circuit 23 changes the period of clock output Tc outputted from oscillator 22 on the basis of value outputted from calculation circuit 22 and rate output circuit 24 generates rate output Tr in synchronism with clock output Tc. That is, as rate output Tr is outputted, due to the resolution of programmable delay line 2111 of oscillator 21, it is possible to generate rate output Tr of high resolution.

Furthermore, as rate output circuit 24 generates rate output Tr in synchronism with clock output Tc, it is not necessary to provide a programmable delay line for synchronizing clock output Tc with rate output Tr. That is, it is possible to constitute a timing generator using only programmable delay line 211 of oscillator 21.

Calibration can be accomplished in the following manner. Since oscillator 21 is formed of a loop delay, calibration is desirable. The calibration is usually performed before using the apparatus. For example, it is performed during the waiting time before starting a test of an LSI device. Calibration circuit 25 receives, as an input from a crystal oscillator (not shown), a calibration clock CLK of a period to which the clock output Tc is desired to be set. Then, calibration circuit 25 calibrates the amount of delay of delay line 211 until calibration clock CLK and clock output Tc become identical to each other. That is, the calibration is performed by varying the current to be applied to current switch 5a of FIG. 2.

In this case, as a method of calibration, the amount of delay of delay line 211 is calibrated not for each clock, but for a time made up of a plurality of clocks. That is, calibration is performed so that a time, made up of a plurality fo calibration clocks CLKs, becomes identical to a time made up of a plurality of clock outputs Tc. In this case, if the number of clocks is sufficiently large, that is, the longer the time, the more accurate will be the calibration.

The synchronization of the embodiment of FIG. 5 with an external apparatus will now be described with reference to FIGS. 7(a),7(b), wherein FIG. 7(a) shows a signal from an external apparatus, and FIG. 7(b) shows clock output Tc from oscillator 21.

In the case of an LSI tester, synchronization with an external apparatus means an operation performed where a signal is desired to be outputted to the target object IC in synchronism with a signal output from the target object IC.

In the above case, the rate output is supplied from the external apparatus. That is, rate output Tr is already determined and clock output Tc synchronized with the rate output Tr is outputted. This rate output is inputted to oscillator 21 as a trigger input. The startable oscillator 21 generates clock output Tc when the trigger input, which is the signal from the external apparatus, rises and stops the generation of the clock output Tc when the trigger input falls. Moreover, the signal from the external apparatus is outputted through rate output circuit 24. In this case, rate output circuit 24 generates a signal in response to the signal received from the external apparatus, and outputs same as rate output Tr.

The invention is not limited to the foregoing. For example, in a structure wherein the amount of delay of delay line 211 is obtained by calculation circuit 22 on the basis of the rate period data and reference period data, calculation circuit 22 may he formed of a counter and a CPU. That is, the counter counts the number of generated clock outputs Tc of a reference period (e.g. 4 ns in the embodiment) and delay control circuit 23 changes the amount of delay of delay line 211 when the count of the counter reaches a desired value. Then, the amount of delay of delay line 211 is applied to delay control circuit 23 from the CPU.

Also, delay control circuit 23 changes the amount of delay of programmable delay line 211 by receiving, as an input, rate output Tr, but, the amount of delay of delay line 211 may be varied according to the output value of calculation circuit 22. In this case, delay control circuit 23 receives clock output Tc as an input, detects the output value of calculation circuit 22 with the timing of clock output Tc and changes the amount of delay of delay line 211 when the value falls within a predetermined range. That is, in this embodiment, delay control circuit 23 detects that the output value or calculation circuit 22 has become smaller than "8 ns" changes the amount of delay of delay line 211 when the clock output Tc rises and returns the amount of delay of delay line 211 to the original value with the rise of clock output Tc, when the output value of calculation circuit 22 becomes larger than "8 ns".

The foregoing description is illustrative of the principles of the invention. Numerous extensions and modifications thereof would be apparent to the worker skilled in the art. All such modifications and extensions are to be considered to be within the spirit and scope of the invention.

What is claimed is:

1. A timing generator for generating a delayed timing signal by delaying an input timing signal, comprising:
    a switch having two ends, a first end thereof being connected to a first voltage source and being controlled by said input timing signal;
    a current source connected to and between a second end of said switch and a second voltage source;
    at least two charge injection circuits, each having an output terminal, a first input terminal, and a second input terminal, and generating a voltage signal which is turned ON and OFF according to said input timing signal and a delay signal, said first input terminal receiving said input timing signal, said second input terminal receiving said delay signal, and said output terminal outputting said generated voltage signal;
    at least two capacitors connected to and between said output terminals of said charge injection circuits and said second end of said switch;
    a comparator for generating said delayed timing signal by comparing voltage at said second end of said switch with a desired voltage, said comparator comprising a first input terminal, a second input terminal, and an output terminal, said first input terminal connected to said second end of said switch, said second input terminal receiving said desired voltage, and said output terminal outputting said delayed timing signal; and
    means connected to said second input terminals of said at least two charge injection circuits for adjusting the delay time of said delayed timing signal.

2. The generator of claim 1, wherein said means for adjusting comprises means for changing the capacitance of each of said capacitors 3. The generator of claim 1, wherein said means for adjusting comprises means for changing the output voltage of each of said charge injection circuits.

4. The generator of claim 1, wherein said means for adjusting comprises means for selecting one of said capacitors and one of said charge injection circuits.

5. A timing circuit for generating a delayed timing signal by delaying an input timing signal, comprising:

a switch having two ends, a first end thereof being connected to a first voltage source, said switch being controlled by said input timing signal;

a current source connected to and between a second end of said switch and a second voltage source;

a charge injection circuit for generating an ON and OFF signal according to said input timing signal and a delay signal, said charge injection circuit comprising an output terminal, a first input terminal, and a second input terminal, said first input terminal receiving said input timing signal, said second input terminal receiving said delay signal, and said output terminal outputting said ON and OFF signal;

a capacitor connected to and between said output terminal of said charge injection circuit and said second end of said switch; and a comparator for comparing a voltage at said second end of said switch and a desired voltage and for generating said delayed timing signal, said comparator comprising a first input terminal, a second input terminal, and an output terminal, said first input connected to said second end of said switch, said second input terminal receiving said desired voltage, and said output terminal outputting said delayed timing signal.

6. The generator of claim 5, 1, 2 or 3, wherein each of said charge injection circuits comprises a current switch which receives said input timing signal and performs current switching, and a buffer which receives an output from said current switch.

7. The generator of claim 5, 2, 3 or 4, wherein each of said charge injection circuits comprises a CMOS switch.

8. A timing generator for generating a timing signal, comprising:

a startable oscillator for generating a clock output, said startable oscillator comprising a gate circuit which receives a trigger input, and a programmable delay line which receives a delay output signal supplied through said gate circuit;

a calculation circuit which receives rate period data and reference period data and which performs calculation to obtain period data for each clock output from said startable oscillator;

a delay control circuit for determining the period of said clock output from said startable oscillator by changing the amount of delay time of said programmable delay line according to value of output of said calculation circuit; and a rate output circuit which generates a rate output in synchronism with said clock output from said startable oscillator according to value of output from said calculation circuit.

9. The generator of claim 8, further comprising a calibration circuit which receives a calibration clock and said clock output and calibrates said delay time of said programmable delay line according to difference between said calibration clock and said clock output.

10. The generator of claim 8, wherein said calculation circuit comprises a register for retaining said rate period data at an initial setting; and a subtractor which receives an output from said register and outputs to said register data obtained by subtracting said reference period data from said output from said register.

11. The generator of claim 8, 9, or 10 wherein said programmable delay line is a timing generator.

* * * * *